United States Patent [19]
Hisada et al.

[11] Patent Number: 5,623,446
[45] Date of Patent: Apr. 22, 1997

[54] SEMICONDUCTOR INTEGRATED CIRCUIT HAVING A VOLTAGE BOOSTER AND PRECHARGING CIRCUIT

[75] Inventors: Toshiki Hisada; Hiroyuki Koinuma, both of Yokohama, Japan

[73] Assignee: Kabushiki Kaisha Toshiba, Tokyo, Japan

[21] Appl. No.: 572,380

[22] Filed: Dec. 14, 1995

Related U.S. Application Data

[63] Continuation of Ser. No. 496,035, Jun. 28, 1995, abandoned, which is a continuation of Ser. No. 286,018, Aug. 4, 1994, abandoned.

[30] Foreign Application Priority Data

Aug. 12, 1993 [JP] Japan .................................. 5-200877

[51] Int. Cl.$^6$ .................................................. G11C 7/00
[52] U.S. Cl. ..................... 365/189.11; 365/149; 365/203; 327/589
[58] Field of Search .............................. 365/189.11, 149, 365/203; 327/530, 390, 540, 589

[56] References Cited

U.S. PATENT DOCUMENTS

| | | | |
|---|---|---|---|
| 4,382,194 | 5/1983 | Nakano et al. | 327/589 |
| 5,175,448 | 12/1992 | Fujii | 327/589 |
| 5,243,574 | 9/1993 | Ikeda | 365/203 X |
| 5,291,450 | 3/1994 | Fujiwara et al. | 365/203 |
| 5,355,343 | 10/1994 | Shu et al. | 365/203 |

FOREIGN PATENT DOCUMENTS 61-273792 12/1986 Japan .

*Primary Examiner*—Son T. Dinh
*Attorney, Agent, or Firm*—Loeb & Loeb LLP

[57] ABSTRACT

A DRAM operable in a precharge cycle and an activation cycle, includes word lines, bit lines in which a first bit line and a second bit line are included, memory cells located between the first bit line and the second bit line, a first node and a second node through which data in the memory cell is transferred, a transfer gate to connect the first bit line to the first node and the second bit line to the second node, a sense amplifier located between the first node and the second node, an equalizer for equalizing the first node and the second node located between the first node and the second node, a voltage booster for boosting the control signal for the transfer gate and the equalizer. In the DRAM, the control signals for the transmisiion gate and the equalizer are set at $V_{CC}$ during the precharge cycle, and boosted above $V_{CC}$ in the activation cycle after the precharge cycle, and the control signal for the transfer gate is changed to $V_{CC}$ and the control signal for the equalizer is changed to the ground potential $V_{SS}$ in synchronization with a selection of the word line.

72 Claims, 10 Drawing Sheets

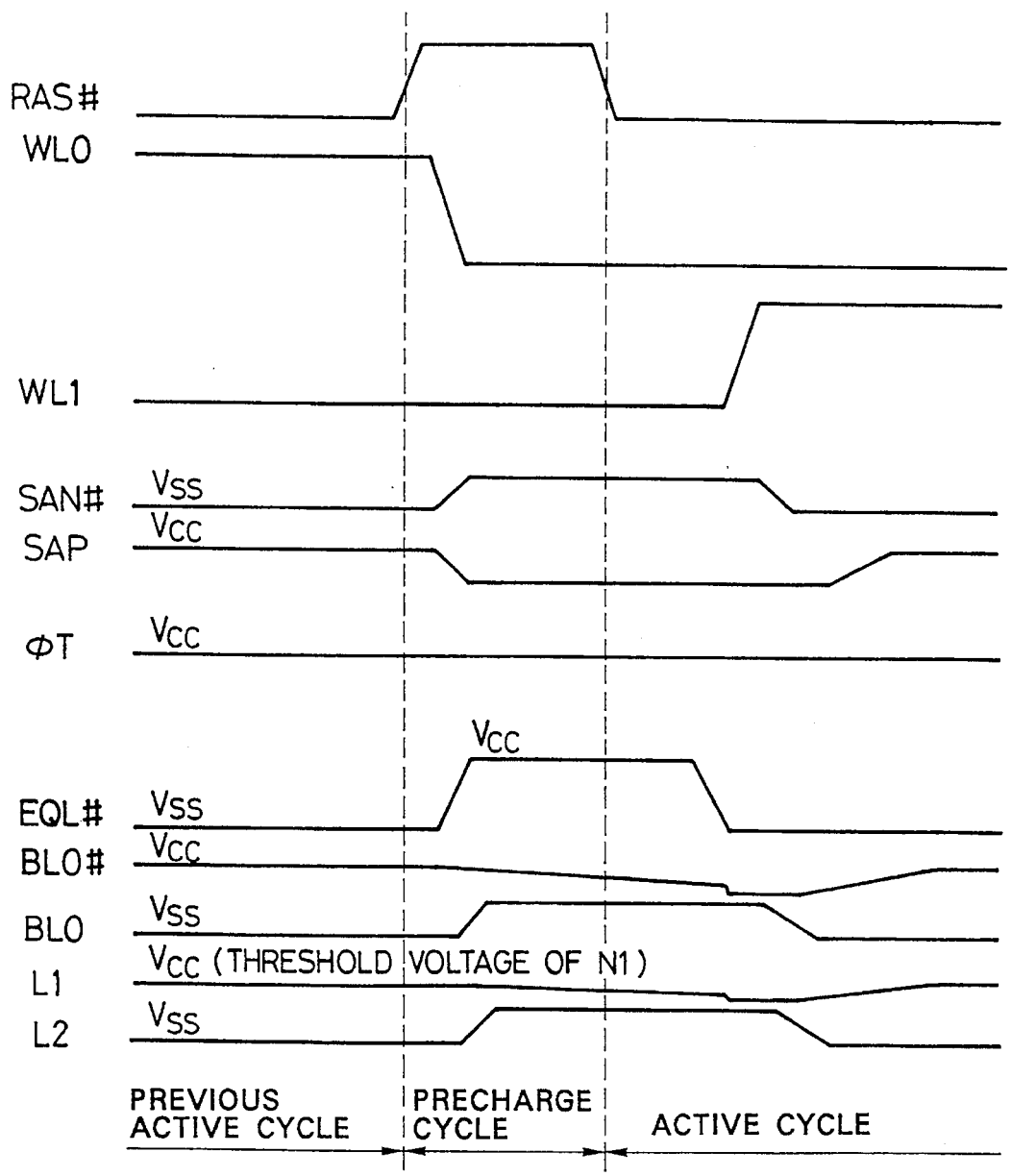

SEMICONDUCTOR INTEGRATED CIRCUIT HAVING A VOLTAGE BOOSTER AND PRECHARGING CIRCUIT

This is a continuation of application Ser. No. 08/496,035, filed Jun. 28, 1995, now abandoned, which is a continuation of application Ser. No. 08/286,018, filed Aug. 4, 1994, now abandoned.

BACKGROUND OF THE INVENTION

1. Field of the Invention

The present invention relates to a semiconductor integrated circuit such as a Dynamic Random Access Memory (DRAM) or the like, and, in particular, to a semiconductor integrated circuit which is capable of extending operating margin of a bit line equalizer in a low voltage range with high reliability.

2. Description of the Prior Art

Problems involved in conventional semiconductor integrated circuits will now be explained with reference to FIGS. 1, 2, and 3. In the following explanation, where the name of a signal line is followed by the symbol # this signifies that the signal line operates a negative logic signal.

In FIG. 1 a plurality of memory cells, for example cells C1 and C2, are connected to a bit line pair BL0 and BL0#. At the rising edge of a word line WL0 or WL1 selected at a row address, a charge stored in a capacitor in a memory cell is transferred to a bit line which has already equalized by an equalizer El, so that a small potential difference is produced between the bit lines BL0 and BL0#.

A pair of NMOS transistors N1 and N2 as transfer gates transmit the potential difference in the bit lines BL0 and BL0#to nodes L1 and L2, and the small potential difference is sensed by a sense amplifies S1 consists of NMOS transistors N3 and N4 operated by an activated signal SAN#.

At this time, a control signal $\phi$ T for the transfer gates N1 and N2 is at the power source potential (Vcc) level. Because the pair of bit lines BL0 and BL0# are at an intermediate potential at the sensing or equalizing, the voltage difference between a source and a bulk (a substrate) of each of the transfer gates N1 and N2 is high, therefore the threshold voltage of the transfer gates N1 and N2 becomes a high value, and the bit line capacitors of the bit lines BL0# and BL0 which is a relatively large is not affected by the nodes L1 and L2. This, therefore, effectively raises the sense margin.

Next, when the bit lines BL0# and BL0 enter a precharge cycle, a control signal EQL# for an NMOS transistor N5, which is an equalizing gate for an equalizing circuit El, is at the H level, and then an equalizing operation for the bit lines BL0 and BL0# is started.

FIG. 2A shows a conventional equalizing circuit E2 having another configuration to which have been added NMOS transistors N7 and N8, which supply a signal VBL of ½ Vcc level to the equalizing circuit El, as shown in FIG. 1. The bit lines BL0 and BL0# can be precharged to ½ Vcc level by the equalizing circuit E2.

FIG. 2B is a conventional circuit diagram for a sense amplifier S2 used for a restore operation which write data on the bit lines BL0 and BL0# to the memory cells C1 and C2. The sense amplifier S2 consists of a pair of PMOS transistors P1 and P2. Because the sense amplifier S1 shown in FIG. 1 is a circuit for amplifying a bit line of a lower potential in the bit lines BL0 and BL0# at the falling edge of an activation signal SAN#, the sense amplifier S2 used for the restore operation, shown separately in FIG. 2B, is necessary for setting the bit line on the side which is at the H level to the Vcc level.

In the sense amplifier S2 for the restore operation, the bit line of the H level is amplified at the rising edge in an activation signal SAP. When the activation signal SAN# falls down and there is some voltage difference between the nodes L1 and L2, the activation signal is raised.

The above circuit configuration of the pair of the equalizing circuit E2 and the sense amplifier S2 is one part of a column in the DRAM, and a plurality of the circuits of this type exists on a memory chip of a DRAM.

There is a problem on the read/write operation in this type of DRAM of the conventional semiconductor integrated circuit in which the equalization for the bit lines BL0 and BL0# cannot be completed when the DRAM operates with a lower source voltage.

An explanation of the conventional problem described above will now be made with reference to the timing chart shown in FIG. 3, which represents the state of the signal lines and nodes.

At the previous active cycle, a word line WL0 is selected, and data stored in the memory cell C2 is transmitted to the bit line BL0 and the node L2 which are at a Low level (L level). When a row address strobe signal RAS# is changed from the L level to a High level (H level) and the bit line BL0 and BL0# enter a precharge cycle, the word line WL0 enters a $V_{SS}$ level, the activation signals SAN# and SAP a $V_{BL}$ level, the control signal $\phi$ T the $V_{CC}$ level, and the control signal line EQL# the $V_{CC}$ level. Then, a VBL precharge operation and the equalizing operation are commenced for the bit lines BL0 and BL0#.

Specifically, the $V_{BL}$ level supply from the NMOS transistor N8 in the equalizing circuit E2 to the bit line BL0 of the L leveled is commenced. The $V_{BL}$ level supply from the NMOS transistor N7 in the equalizing circuit E2 is commenced to the bit line BL0# of the H level. In this case, the voltage potential of the bit line BL0# is decreased. In addition, an equalizing operation, whereby the bit lines BL0 and BL0# at H and L levels are shorted, is commenced by the NMOS transistor N6.

When the relationship among the voltage potentials of the various transistors are observed at this time, the $V_{BL}$ level is applied to the drain, the $V_{CC}$ level to the gate, and a $V_{BB}$ level to the bulk or the substrate, in the NMOS transistor N8. The bit line BL0 of the L level, which is connected to the source, is charged from the $V_{SS}$ level to the $V_{BL}$ level.

The $V_{BL}$ level is applied to the source and the $V_{CC}$ level to the gate in the NMOS transistor N7. The bulk voltage becomes the ($V_{BL}$–$V_{BB}$) level and is higher than that of the NMOS transistor N8. For this reason, the threshold value of the NMOS transistor N7 becomes extremely high by the bulk bias reliability of the transistors, and the transconductance gm of the NMOS transistor N7 drops to approximately a OFF state.

In addition, the transistor characteristic such as the transconductance of the NMOS transistor N6 in the equalizing circuit E2, in which the bit line BL0 of the L level is connected to the source of the NMOS transistor N6 and the bit line BL0# of the H level to the drain of the NMOS transistor N6, becomes approximately equal to the transistor characteristics of the NMOS transistor N7 in accordance with the increasing of the bit line BL0 of the L level (the voltage potential of the bit line BL0) under the condition that the gate of the NMOS transistor N6 is in the $V_{CC}$ level and the bulk of the NMOS transistor N6 is in the $V_{BB}$ level.

There is no circuit performing the precharge and equalizing operations in the nodes L1 and L2, but these nodes are supplied from the bit lines BL0 and BL0#. Therefore the H level of the node L1 is a voltage which is less than the threshold value of the NMOS transistor N1. The source of the NMOS transistor N1 is connected to the node L1, therefore the NMOS transistor N1 is nearly in the OFF state. The reason that the node L1 is in the $V_{BL}$ level is that the precharge operation of the node L1 is started after the potential voltage of the bit line BL0# is less than that of the node L1, so that the efficiency is very poor.

Next, the case in which the active cycle is entered from this state described above will be considered.

The row address strobe signal RAS# is changed from the H level to the L level, the row address is selected so that the control signal EQL# for the equalizing circuit E2 is at the L level, the voltage potential of the selected word line WL1 rises and the data stored in the memory cell C1 is transmitted to the bit lines BL0 and BL0#.

At this time the memory cell C1 stores the data of zero level "0". However, in this case, until the control signal EQL# falls, the equalizing of the bit lines BL0 and BL0# and the nodes L1 and L2 cannot be completed adequately, therefore even when the data of zero level "0" is read out on the bit line BL0#, the bit line BL0 becomes as the bit line of the H level becomes lower than that of the bit line BL0#, therefore the data of the high level "1" is erroneously read out as the state of the low level "0".

As outlined above, when a lower source voltage is used for executing a conventional semiconductor integrated circuit such as a DRAM, there is the problem that the equalizing operation for bit lines cannot be completed within the precharge operation period so that an erroneous operation occurs.

SUMMARY OF THE INVENTION

Accordingly, an object of the present invention is, with due consideration to the drawbacks of such conventional semiconductor integrated circuits, to provide a highly reliable semiconductor integrated circuit by expanding the low voltage operating margin of the bit line equalizing operation.

A preferred embodiment of a semiconductor integrated circuit according to the present invention including a plurality of memory cells arranged in matrix, selected by a plurality of word lines and a plurality of bit lines, operable in a precharge cycle and an activation cycle, comprises:

a word line in the word lines for selecting a group of the memory cells;

a first bit line and a second bit line in the bit lines, for selecting a pair of the memory cells located between the first bit line and the second bit line;

a first node and a second node through which data to or from the pair of the memory cells is transferred;

transfer means controlled by a first control signal, for connecting the first bit line to the first node and the second bit line to the second node;

sense amplifier means controlled by a second control signal, for sensing data on the first node and second node, located between the first node and the second node;

equalizing means controlled by a third control signal, for equalizing the first node and the second node, located between the first node and the second node;

voltage booster means for boosting the first control signal and the third control signal, wherein the first control signal and the third control signal are set at the power source potential $V_{CC}$ during the precharge cycle, the first control signal and the third control signal are boosted above the power source voltage potential $V_{CC}$ in the activation cycle after the precharge cycle, and the first control signal is changed to the power source voltage potential $V_{CC}$ and the third control signal is changed to the ground potential $V_{SS}$ in synchronization with a selection for the word line.

The semiconductor integrated circuit above, further comprises a second sense amplifier located between the first bit line and the second bit line for restoring data to the pair of the memory cells.

Another preferred embodiment of a semiconductor integrated circuit including a plurality of memory cell being grouped into a plurality of memory cell groups arranged in matrix, each memory cell being selected by a word line and a bit line, operable in a precharge cycle and an activation cycle, comprises:

a first bit line and a second bit line for connecting the memory cells in one memory cell group;

a first node and a second node through which data to or from the memory cells in one memory cell group is transferred;

transfer means controlled by a first control signal, for connecting the first bit line to the first node and the second bit line to the second node;

sense amplifier means controlled by a second control signal, for sensing data on the first node and second node, located between the first node and the second node;

equalizing means controlled by a third control signal, for equalizing the first node and the second node, located between the first node and the second node;

shared sense amplifier means controlled by a fourth control signal, located between two adjacent memory cell groups; and voltage booster means for boosting the first control signal and the third control signal located per a predetermined number of memory cell groups, wherein by the voltage booster means, during the precharge cycle, the first control signal and the third control signal of the memory cell group are set at the power source potential $V_{CC}$, the first control signal of the memory cell group selected by the word line are boosted above the power source voltage potential $V_{CC}$ in the activation cycle after the precharge cycle, the first control signal of the memory cell group un-selected by a word address on the word line are set at the power source voltage potential $V_{SS}$ in the activation cycle after the precharge cycle, and the third control signal of the memory cell group selected by the word line is changed to the ground potential $V_{SS}$ and the third control signal of the memory cell group un-selected by the word address on the word line is changed to the ground potential $V_{CC}$.

In the semiconductor integrated circuit above, the voltage booster means comprises:

a drive circuit for generating a fourth control signal indicating the activation cycle and a fifth control signal indicating a non-activation cycle based on the word address on the word line; and a voltage booster circuit for inputting the fourth control signal and the fifth control signal from the drive circuit, and for boosting the fourth control signal and the fifth control signal, and outputting them as the first control signal and the third control signal, respectively.

In the semiconductor integrated circuit, the voltage boosting means further comprises:

a voltage boosting level control circuit for setting the fourth and the fifth control signal below at a voltage potential which is the sum of the power source voltage $V_{CC}$ and the threshold voltage potential of the transfer means during the activation cycle.

BRIEF DESCRIPTION OF THE DRAWINGS

These and other objects, features, and advantages of the present invention will become more apparent from the following description of the preferred embodiments taken in conjunction with the accompanying drawings, in which:

FIG. 3 is a timing chart for control signal lines and nodes in the conventional semiconductor integrated circuit shown in FIG. 1.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

FIRST EMBODIMENT

Figure 4:
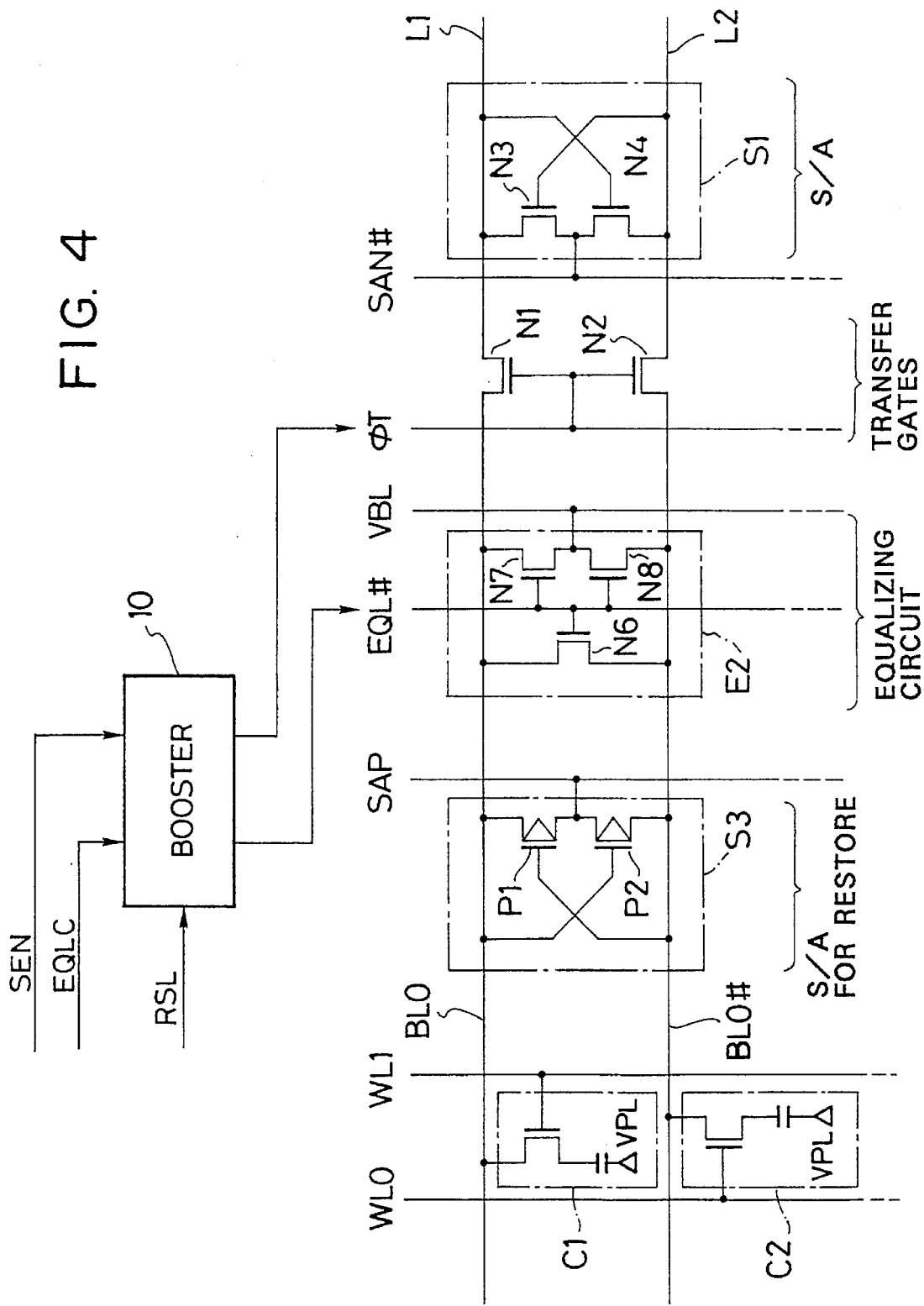
FIG. 4 is a circuit configuration diagram for a first embodiment of a semiconductor integrated circuit such as DRAM of the present invention.

FIG. 4 shows a circuit configuration diagram for a first embodiment of a semiconductor integrated circuit of the present invention.

Figure 1:
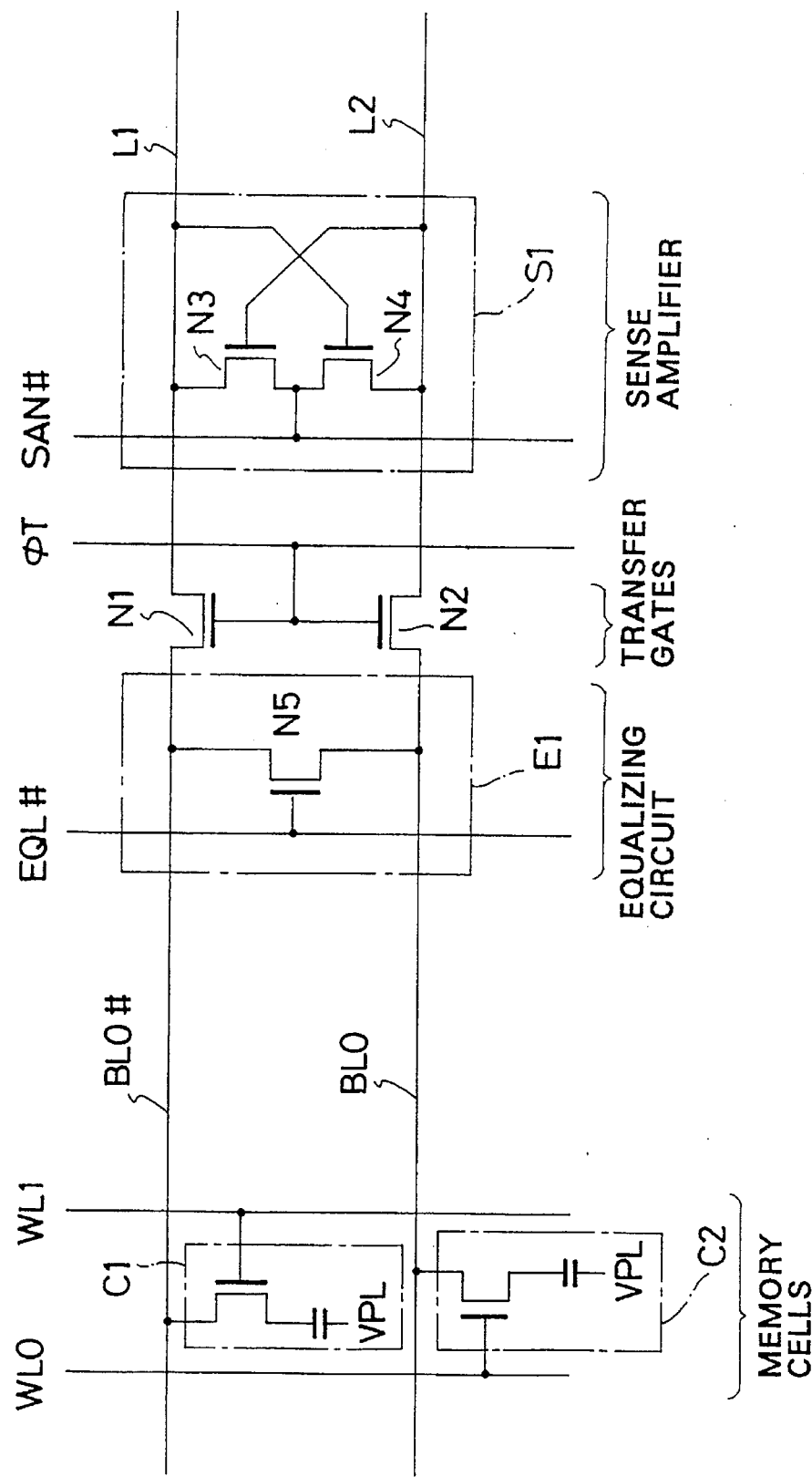
FIG. 1 is a circuit configuration diagram for a conventional semiconductor integrated circuit such as a DRAM.
Figure 2B:
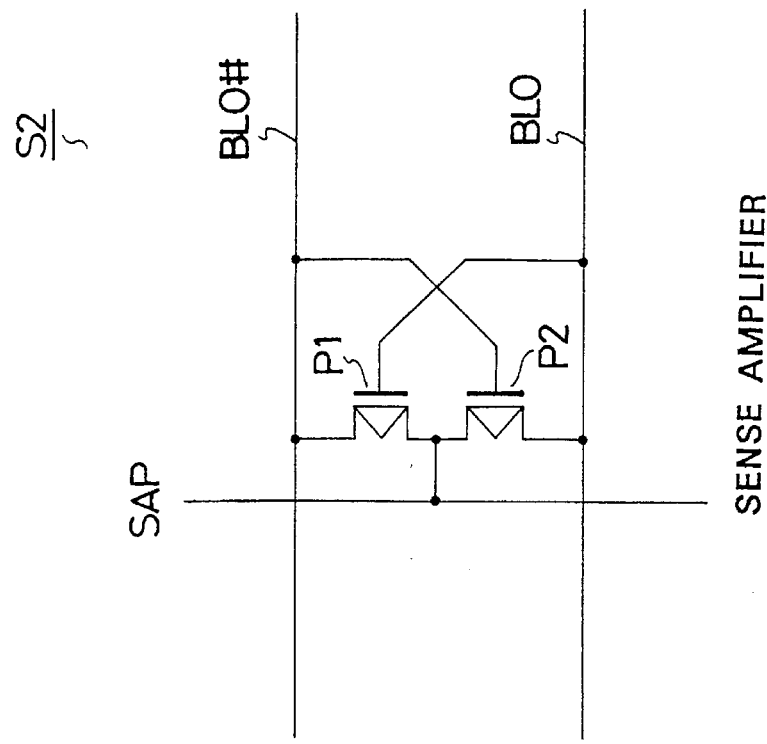
FIG. 2B is a circuit diagram of a sense amplifier having another configuration.
Figure 2A:
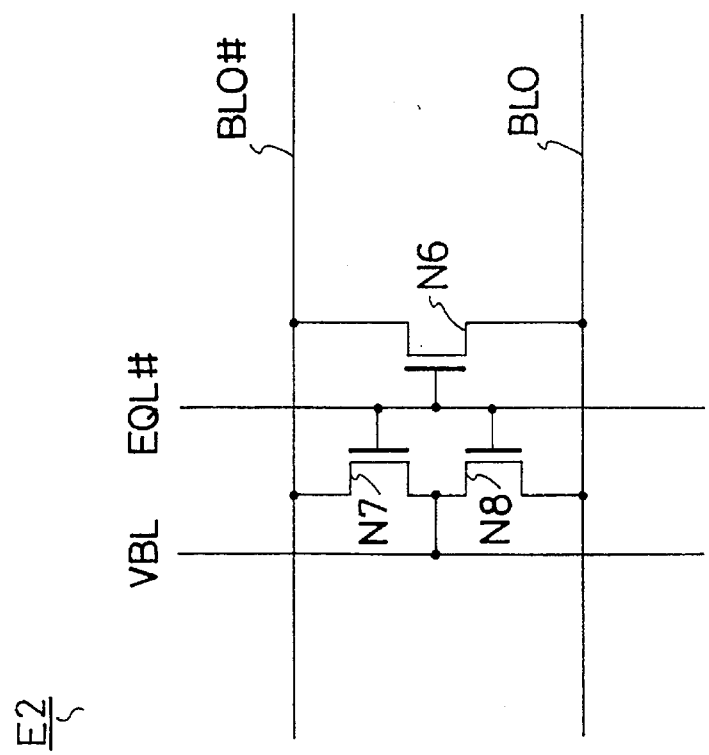
FIG. 2A is a circuit diagram for an equalizing circuit having another configuration.

Reference numerals in this drawing which designate parts which are identical or corresponding to parts in the conventional semiconductor integrated circuit (FIGS. 1, 2A, and 2B) have been assigned the same reference numerals and further explanation has therefore been omitted.

The semiconductor integrated circuit such as a DRAM of the present embodiment includes memory cells C1 and C2, a sense amplifier S3 for restore data to the memory cells C1 and C2, an equalizing circuit E2(equalizing means), transfer gates (first and second transfer means) N1 and N2, a sense amplifier S1 (differential amplifier circuit), and a booster 10 as a voltage booster means for providing a desired voltage to the equalizing circuit E2 and the transfer gates N1 and N2.

The sense amplifier S1 is activated by an activation signal (first signal) SAN# and is located between first and second nodes L1 and L2 for the sense amplification. The transfer gate N1 is connected to the first node L1 and the third node BL0, and the transfer gate N2 is connected to the second node L2 and the fourth node BL0#. The gates N1 and N2 are controlled by a second control signal φ T.

The equalizing circuit E2 is connected to the second and fourth nodes BL0 and BL0# and its operation is controlled by the third equalizing signal EQL#.

The memory cells C1 and C2 are selected by the word lines WL0 and WL1 and the nodes BL0 and BL0# as a bit pair lines (a pair of nodes).

The booster 10 shown in FIG. 4 inputs control signals EQLC and SEN and generates a control signal φ T and the equalizing signal EQL# by delaying a row address signal RSL transmitted from a row address decoder (not shown) and a row address strobe signal RAS# with a predetermined delay time.

Specifically, the control signal φ T and the equalizing signal EQL# are set at the source potential $V_{CC}$ during a precharge cycle, and when a write-in to the memory cells C1 and C2 or a read-out are commenced, the voltage potentials of the control signal φ T and the equalizing signal EQL# are boosted above the source potential $V_{CC}$.

Then, synchronized with the selection operation of the word lines WL0 and WL1, the control signal φ T is shifted to the source potential $V_{CC}$, and the equalizing signal EQL# is changed to the ground potential $V_{SS}$.

Figure 5:
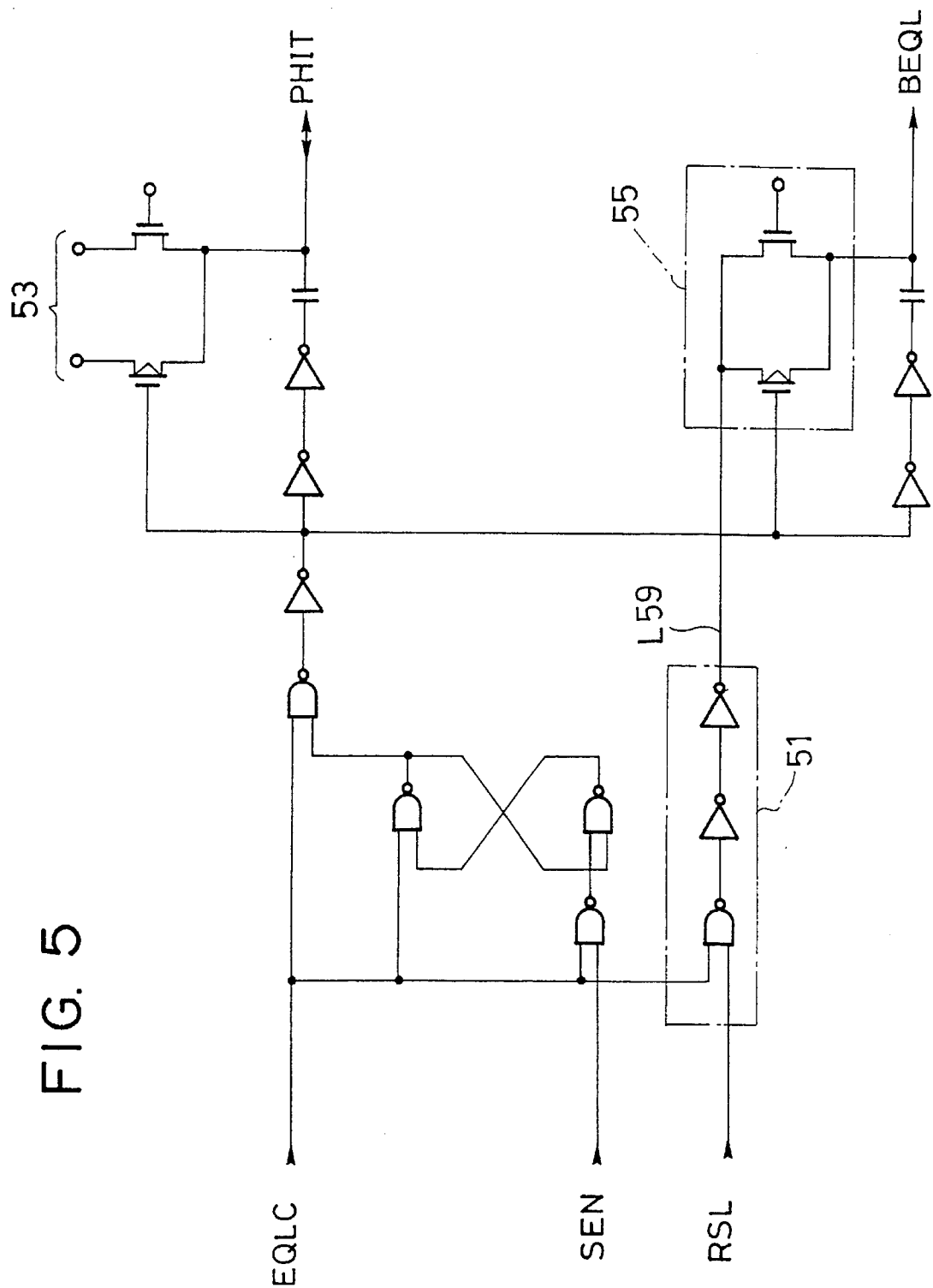
FIG. 5 is a circuit diagram of the booster incorporated in the semiconductor integrated circuit shown in FIG. 4.

FIG. 5 shows a detailed configuration diagram of the voltage booster 10 incorporated in the semiconductor integrated circuit as the first embodiment shown in FIG. 4.

In FIG. 5, the voltage booster 10 in general comprises a drive circuit 51 for selecting activation or inactivation of a word line based on a row address signal, and outputting a control signal L59, a voltage booster circuit 53 for boosting the voltage of the control signal L59 and outputting this signal as the control signal φ T and the equalization signal EQL#, a voltage booster level control circuit 55 for restraining the voltage boosted potential of the control signals φ T and the equalization signals EQL# to below the voltage value of the sum of the source potential $V_{CC}$ and the value of the threshold voltage of the transistor when a write-in to the memory cell or a read-out is activated, and other control circuits.

Next, the operation of the semiconductor integrated circuit as the first embodiment will be explained.

Figure 6:
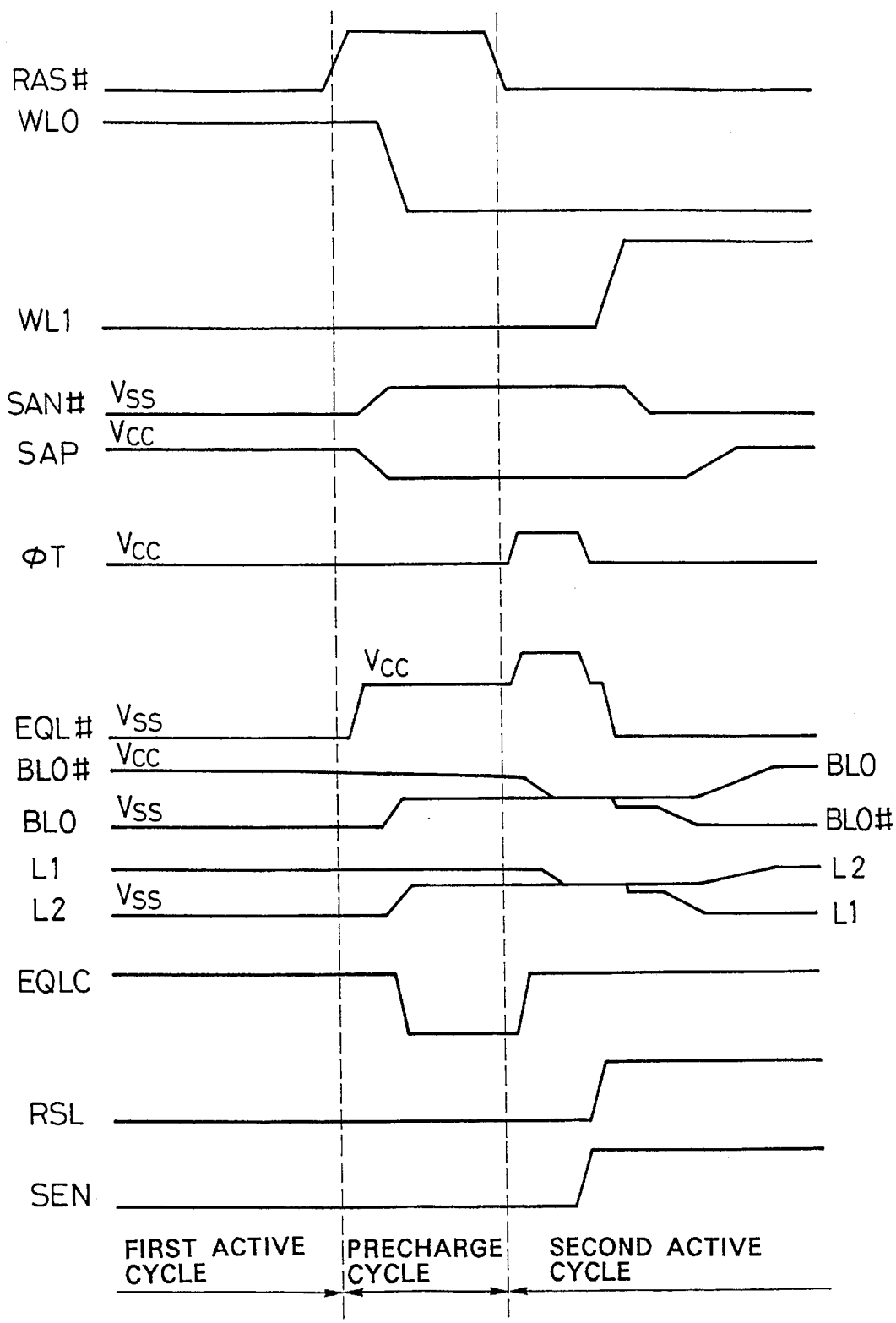
FIG. 6 is a timing chart for the signal lines and nodes in the first embodiment of the semiconductor integrated circuit.

FIG. 6 is a timing chart for the signal lines and nodes in the present embodiment of the semiconductor integrated circuit shown in FIG. 4. The operation from the first active cycle to the end of the precharge is the same as for the conventional example (shown in FIG. 3) so further explanation is omitted.

The following operation occurs at the second active cycle shown in FIG. 6. Specifically, the activation signal SAN# for the sense amplifier S1 and the activation signal SAP for the sense amplifier S3 for restore are both changed to the $V_{BL}$ level.

The equalizing signal EQL# for the equalizing circuit E2 and the control signal $\phi$ T for the control gates N1 and N2 are both changed to the $V_{CC}$ level. In the second active cycle, the nodes L1 and L2 are being equalized and the node L1 and L2 has a voltage difference based on the characteristics of the NMOS transistors N3 and N4.

In this situation, the voltages of the equalizing signal EQL# and the control signal $\phi$ T are boosted by the voltage booster 10 based on the control signal EQLC at the H level (or rising edge) in synchronization with the L level (or falling edge) of the row address strobe signal RAS#. As a result, a back bias becomes high and it is possible to compensate for a reduction of the transistor characteristics of the transfer gates N1 and N2 (the corresponding relative conductance gm of the transistor increases N1 and N2) so that it is possible to complete the VBL precharge and equalization operation of the bit lines BL0, BL0# and the nodes L1, L2.

The equalizing signal EQL# and the control signal $\phi$ T boosted by the control signal SEN for the activation signal SAN# are changed or returned to the $V_{CC}$ level. Then, the equalizing signal EQL# reaches the $V_{SS}$ level in synchronization with the H level (the rising edge) of the row address signal RSL for selecting a word line.

This is because the sense operation by the sense amplifier S1 through the transfer gates N1 and N2 is free from the bit line capacities of the bit lines BL0 and BL0#.

Further, when the equalizing signal EQL# is changed to the $V_{SS}$ level, the potential of the word line WL0 or WL1 rises, and the equalizing operation is completed because the cell data read-out operation is started.

As outlined above, with the semiconductor integrated circuit of the first embodiment, even if the transistor characteristics such as a transconductance $\phi$ m become worse when the low power source is used, and an active cycle is entered in which the precharge operation and equalizing operations for the bit lines BL0 and BL0# cannot be completed, the transistor characteristics are improved by boosting the voltage of the equalizing signal EQL# and the control signal $\phi$ T in the interval from the falling edge of the row address strobe signal RAS# to the rising edge of the control signal SEN, so that the precharge and equalizing operations can be completed.

Figure 7:
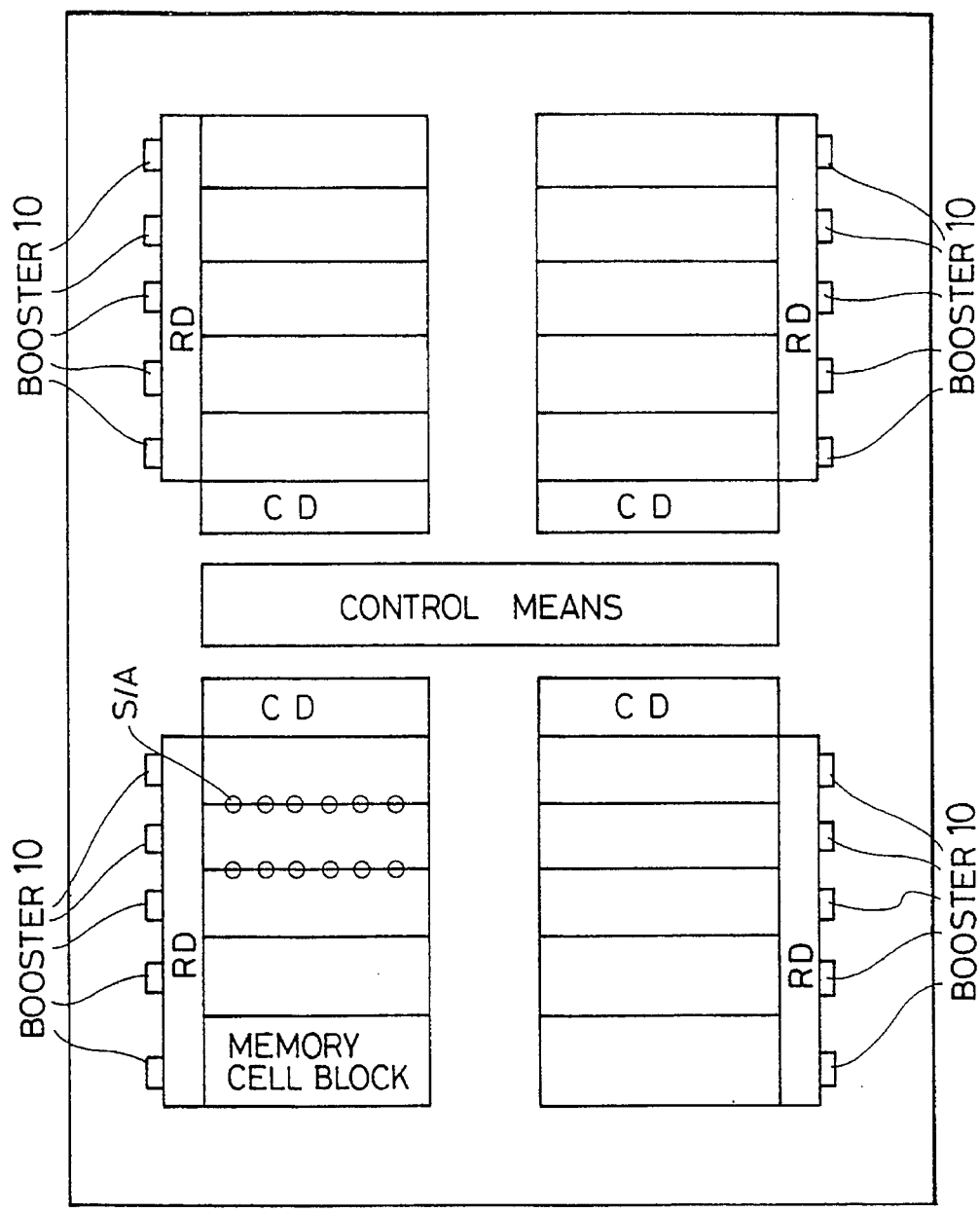
FIG. 7 is a general view of a basic configuration of the semiconductor integrated circuit shown in FIG. 4.

FIG. 7 is a general view of a basic configuration of the semiconductor integrated circuit such as a DRAM shown in FIG. 4.

In FIG. 7, there are four memory cell blocks, each of which the desired number of the voltage boosters 10 are incorporated shown in FIG. 5 at the outside of each blocks. In FIG. 7, the fererence character CD indicates a column decoder, the RD denotes a Row decoder, the S/A denotes a sense amplifier.

As described above, the semiconductor integrated circuit as the first embodiment of the present invention, as shown in FIGS. 4, 5, 6, and 7 inputs the equalizing control signal EQL and the sense amplifier control signal SEN generated by delaying the row address signal RSL from a row address decoder and a row address strobe signal RAS# with a desired delay time interval by means of a voltage booster 10. Then, the second signal $\phi$ T (control signal) and the third signal EQL# (equalizing signal) are set at the source potential $V_{CC}$ in the precharge cycle. When a write-in to memory cells C1 and C2 or a read-out is activated, the voltage is then boosted above the source potential $V_{CC}$, the second signal $\phi$ T is changed to the source potential $V_{CC}$ synchronized with the selection of a word line WL0 and a word line WL1, and the third signal EQL# is shifted to the ground potential $V_{SS}$.

In this manner, in the period from the falling edge of the row address strobe signal line RAS# until prior to the activation of a differential amplifier circuit S1, a voltage boost is provided to transfer means N1 and N2 of bit lines BL0 and BL0# respectively, and to control signals $\phi$ T and EQL# which supply an equalizing means E2.

The back bias therefore becomes high, and it is possible to compensate for a decrease in transistor characteristics. The equalization efficiency increases and, as a result, the low voltage operation margin for the bit line equalization is extended. It is therefore possible to provide a semiconductor integrated circuit of high reliability.

SECOND EMBODIMENT

Figure 8:
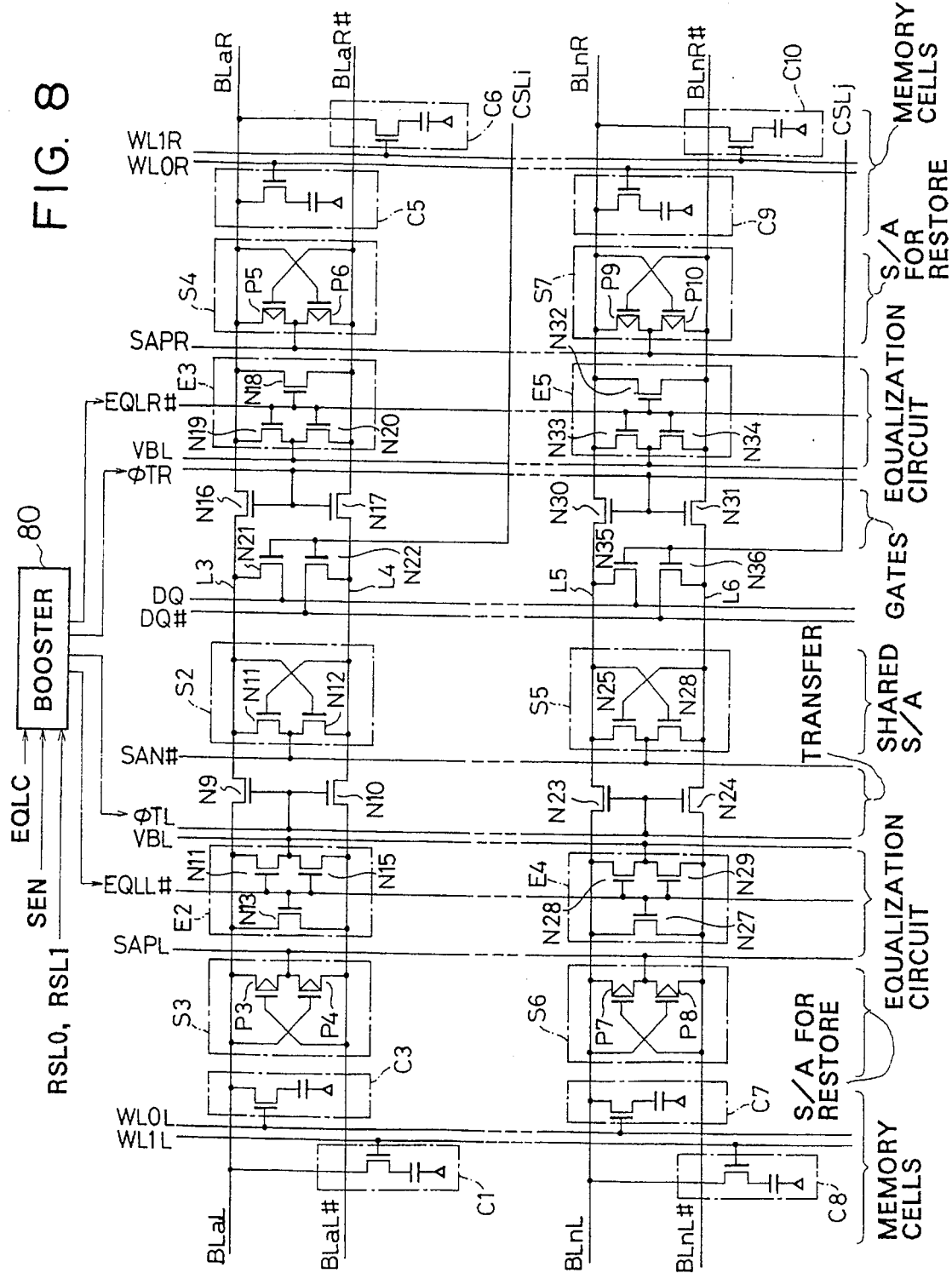
FIG. 8 is a configuration diagram for a second embodiment of a semiconductor integrated circuit (a DRAM using a shared sense amplifier) of the present invention.

FIG. 8 is a circuit configuration diagram for a second embodiment of a semiconductor integrated circuit of the present invention. The present invention is applied to a shared sense amplifier in this second embodiment. The semiconductor integrated circuit such as a DRAM of the second embodiment comprises a memory cell array made up of two groups of memory cells, C3, and C4; sense amplifiers for restore S3, and S4 (first and second restore circuits); equalizing circuits E2, and E3 (equalizing means); transfer gates N9, N10, N16, and N17 (first, second, third, and fourth transfer means); and a sense amplifier S2 (differential amplifier circuits).

The sense amplifier S2 is a commonly known level detection sense amplifier which detects a minute potential difference between the first and second nodes L3 and L4. When the first activation signal SAN# is at the L level, the L level side of the node L3 or the node L4 is amplified.

The restore circuits S3 and S4 are sense amplifiers made up of PMOS transistors P3, P4 and P5, P6 which compensate for the H level of the bit lines.

The H level of a fourth activation signal SAPL or a seventh activation signal SAPR, of which either one is selected, is received during the active operation from the row address, and compensates for the H level side of the third or fourth nodes BLaL, BLaL# or the fifth or sixth nodes BLaR, BLaR#.

During the precharge period the voltage $V_{BL}$ is supplied to the activated signal lines SAN#, SAPL, and SAPR. The transfer gate (NMOS transistor) N9 is connected to the first node L3 and the third node BLaL, and the transfer gate N10 is connected to the second node L4 and the fourth node BLaL#. These gates are controlled by the second control signal $\phi$ TL. The transfer gate N16 is connected to the first node L3 and the fifth node BLaR, and the transfer gate N17 is connected to the second node L4 and the sixth node BLaR#. These gates are controlled by the fifth control signal $\phi$ TR. Either one of the control signals $\phi$ TL and $\phi$ TR is selected during an activation operation by the row address.

The equalization circuits E2 and E3 are circuits for bit line equalization and precharge operations and are made up of the NMOS transistors N13, N14, N15, and N18, N19, N20 respectively.

The equalization circuit E2 is connected to the third and fourth nodes BLaL and BLaL# and is controlled by the third equalization signal EQLL#. The equalization circuit E3 is connected to the fifth and sixth nodes BLaR and BLaR# and is controlled by the sixth equalization signal EQLR#.

Either of the equalization signals EQLL# and EQLR# is selected by the row address during an activation operation. In unselected equalization circuits, the equalization and precharging operations of the bit line are continuous.

The memory cells C3 and C4 are selected by the word lines WL0L and WL1L via the nodes BLaL and BLaL# as bit pair lines.

The memory cells C5 and C6 are selected by the word lines WL0R and WL1R through the nodes BLaR and BLaR# as bit pair lines.

Specifically, the NMOS transistor connected to the selected word line is turned ON in order to transmit cell data stored in a capacitor section in a memory cell to the bit line.

NMOS transistors N21 and N22 are used for transmitting the potential difference of the nodes L3 and L4 amplified by the sense amplifier S2 to data lines DQ and DQ#, and the NMOS transistors N21 and N22 are driven by setting a signal CSLi at the H level. The data lines DQ and DQ# are connected to I/O circuits (not shown).

The semiconductor integrated circuit of the second embodiment comprises a plurality of circuits of the above-mentioned configuration. The circuits on the lower stage in FIG. 8 exist at n locations below the circuits of the configurations explained above.

When the signal CSLj is selected by a column address, NMOS transistors N35, N36 are opened, and the data lines DQ and DQ# are connected to the bit lines (nodes L5 and L6).

In a actual semiconductor integrated circuit, there is a plurality of memory cells and word lines which form a cell array from left to right, viewed from the sense amplifiers S2, S5.

However, the explanation here will be given for a configuration of the semiconductor integrated circuit which includes word lines 2×2 and one pair of bit lines ×2.

Next, the voltage booster means 80 inputs control signals EQLC and SEN generated by delaying row address signals RSL0 and RSL1 transmitted from a row address decoder and a row address strobe signal RAS# with a desired delay interval and then generates the control signals φTL and φTR and the equalizing signals EQLL# and EQLR#.

Specifically, the control signals φ TL and φ TR and the equalizing signal EQLL# and EQLR# are boosted above the source potential $V_{CC}$ during the activation of a write-in to the memory cells C3, C4 and C5, C6, or a read-out.

Synchronized with the selection of the word lines WL0L, WL1L and WL0R, WL1R, the control signal φ TL or φ TR of the memory cell array selected by means of a row address are changed to the source potential $V_{CC}$, unselected control signal φ TL or φ TR of the memory cell array side are changed to the ground potential $V_{SS}$, equalization signal EQLL# or EQLR# of the memory cell array side selected by means of a row address are changed to the ground potential $V_{SS}$; and unselected equalization signal EQLL# or EQLR# of the memory cell array side are changed to the source potential $V_{CC}$.

Figure 9:
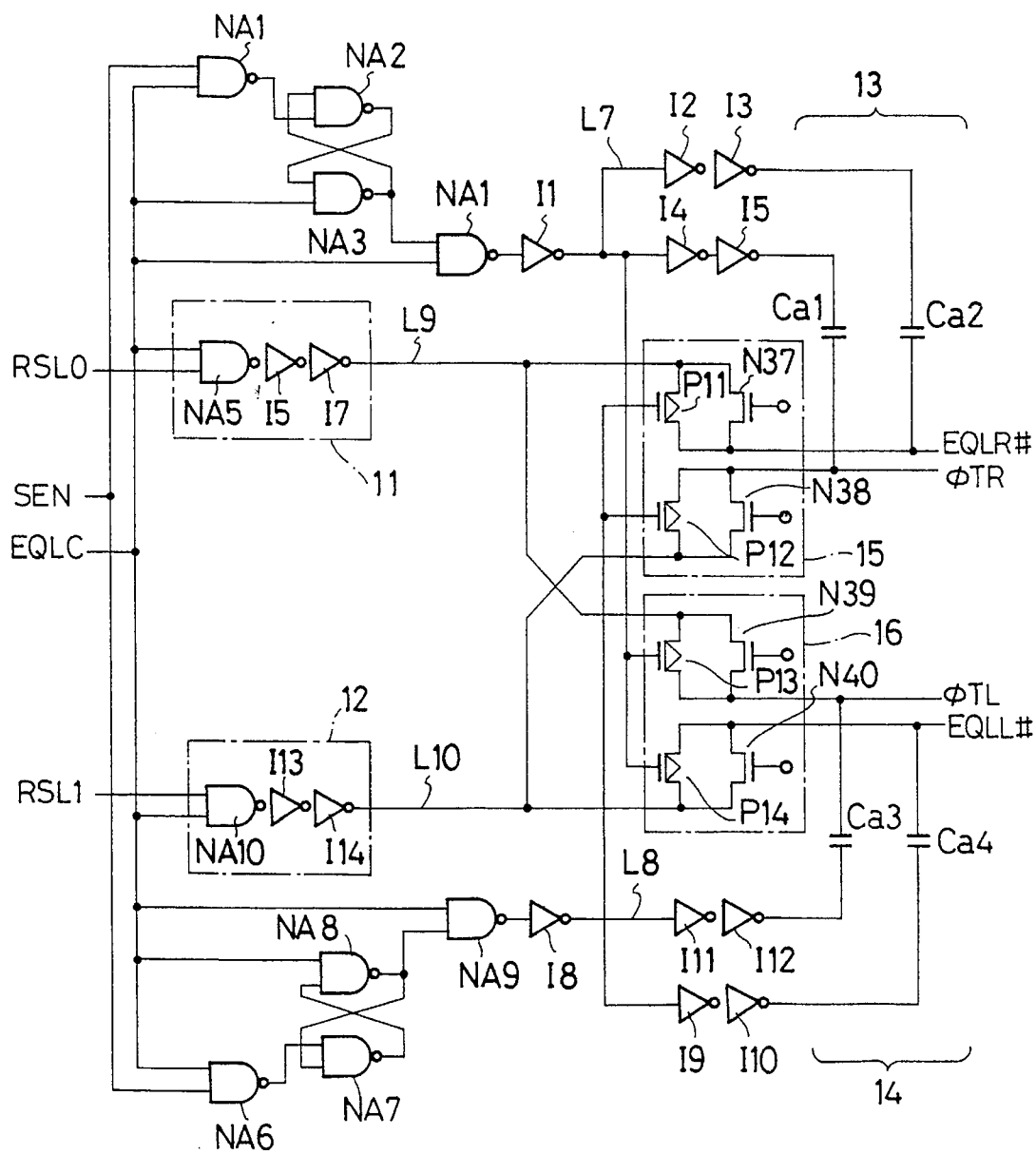
FIG. 9 is a detailed circuit diagram of a booster incorporated in the second embodiment of the semiconductor integrated circuit shown in FIG. 8.

FIG. 9 is a detailed circuit diagram of the voltage booster 80 used in the second embodiment of the semiconductor integrated circuit as shown in FIG. 8.

The voltage booster 80 in general comprises drive circuits 11 and 12 for selecting activation or inactivation of a word line based on a row address signal, and outputting eighth and ninth signals L9 and L10; a voltage booster circuit 13 for boosting the voltage of the eighth signal L9 and outputting this signal as the control signal φ TR and the equalization signal EQLR#; a voltage booster circuit 14 for boosting the voltage of the ninth signal L10 and outputting this signal as the control signal φ TL and the equalization signal EQLL#; voltage booster level control circuits 15 and 16 for restraining the voltage boosted potential of the control signals φ TL, φ TR and the equalization signals EQLL#, EQLR# to below the voltage value of the sum of the source potential $V_{CC}$ and the value of the threshold voltage of the transistor when a write-in to the memory cell or a read-out is activated; and other control circuits.

The operation in the precharge and active states of the voltage booster means 80 will now be explained with reference to the timing chart of FIG. 10.

During the precharge operation, the equalization control signal EQLC, the sense amplifier control signal SEN, and the row address signals RSL0 and RSL1 are at L level, while the control signals φ TL and φ TR and the equalization signals EQLL# and EQLR# are at H level.

The equalization control signal EQLC rises to the H level (rising edge) in synchronization with the L level (falling edge) of the row address strobe signal RAS#. At this time, because the signals L7 and L8 are at the H level, PMOS transistors P11, P12, P13, and P14 in the voltage booster level circuits 15 and 16 become the OFF state, the NMOS transistors N37, N38, N39, and N40 are in the cut-off state; the control signals φ TL and φ TR and the equalization signals EQLL# and EQLR# are at a floating H level; and the voltages of the control signals φ TL and φ TR and the equalization signals EQLL# and EQLR# are boosted by capacitors Ca1, Ca2, Ca3, and Ca4 in the voltage booster circuits 13 and 14.

The voltage-boosted level is the sum of $V_{CC}$ plus the PMOS transistor threshold voltage or the sum of $V_{CC}$ plus the NMOS transistor threshold voltage. From this operation, gate destruction from exceeding the level is prevented.

Next, the sense amplifier control signal SEN reaches the H level (rising edge), the signals L7 and L8 are set at the L level, the PMOS transistors P11, P12, P13, and P14 are turned on, and the control signals φ TL and φ TR and the equalization signals EQLL# and EQLR# revert to the $V_{CC}$ level.

Next, one of the row address signals RSL0 and RSL1 is selected, but an explanation will be given here as though the row address signal RSL1 has been selected.

The selected row address signal RSL1 becomes the H level, and the unselected row address signal RSL0 is maintained at the L level. At this time the signal L9 is maintained at the H level, and the control signal φ TL and the equalization signal EQLR# become the H level through the transfer gate. In addition, because the signal L10 is at the L level, the control signal φ TR and the equalization signal EQLR# become the L level.

Specifically, during an active operation, the control signal φ T on the selected side and the equalization signal EQL# on the unselected side are at the H level, while the control signal φ T on the unselected side and the equalization signal EQL# on the selected side are at the L level, supplying the transfer gate and the equalization circuit.

Next, the operation of the second embodiment of the semiconductor integrated circuit of the present invention shown in FIGS. 8 and 9 will be explained.

Figure 10:
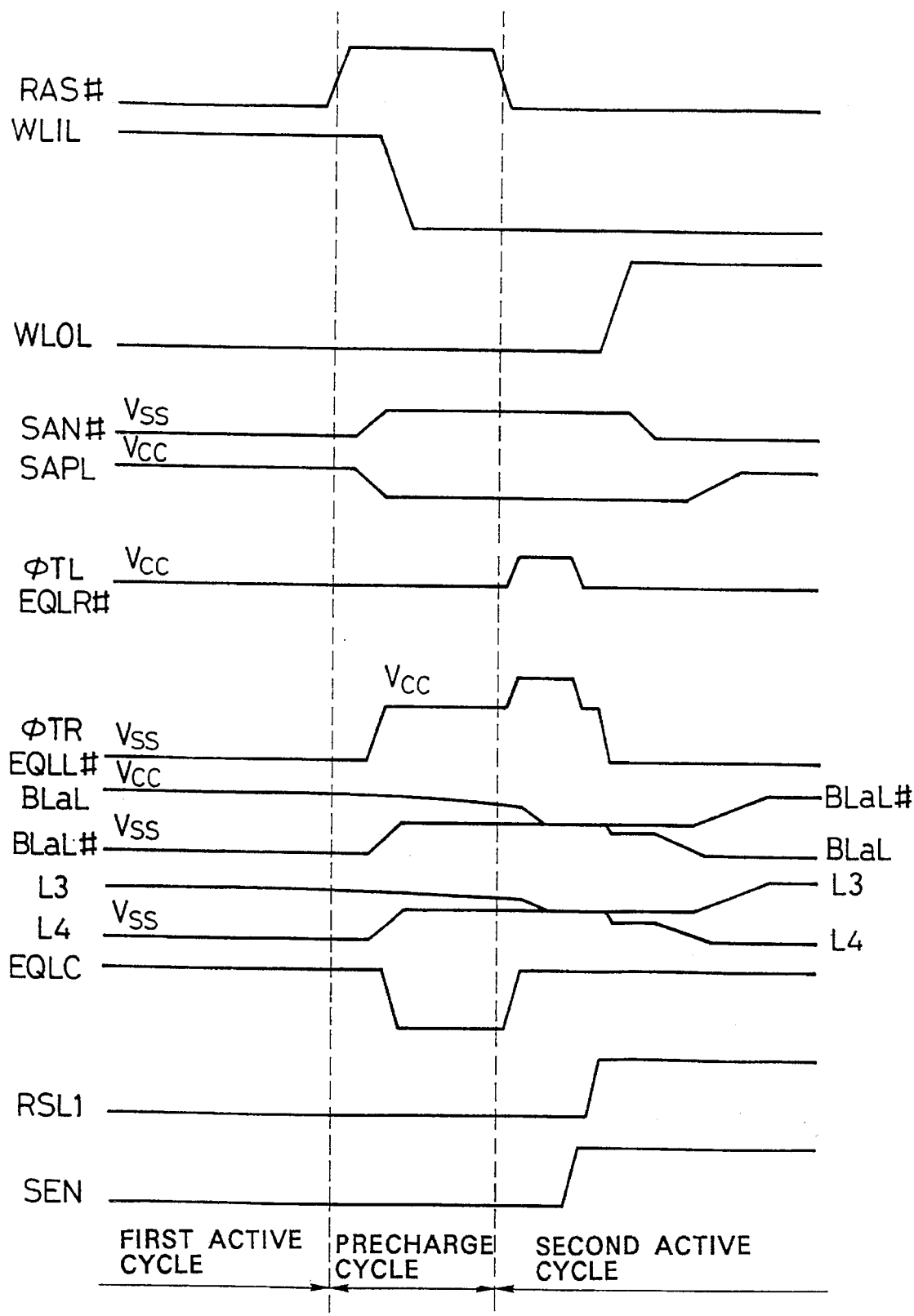
FIG. 10 is a timing chart for a read cycle of signal lines and nodes in the second embodiment of the semiconductor integrated circuit shown in FIG. 8.

FIG. 10 is a timing chart for a read cycle of the signal lines and nodes in the second embodiment of the semiconductor integrated circuit shown in FIG. 8.

The operations will be explained following the sequence of active operation (first active cycle shown in FIG. 10), precharge operation (precharge cycle), and active operation (second active cycle).

In the following explanation, the memory cell array on the left side in FIG. 8 is selected, and the memory cell array on the left side is also selected in the next cycle. The selected word line is switched from WL1L to WL0L and the reversed data from the prior cycle is read out when the cell data in the memory cell C3 is "0" and the cell data in the memory cell C4 is "1".

When the row address strobe signal RAS# becomes the H level and enters the precharge operation, the activated signal SAN# is charged to the $V_{BL}$ level from the L level, and the selected activated signal SAPL is also discharged from the H level to the $V_{BL}$ level. In addition, the unselected activated signal SAPR is maintained at the $V_{BL}$ level during the active operation.

The control signal $\phi$ TL on the selected side is maintained at the H level during the active operation, the transfer gates N9 and N10 are opened (not operated) to connect the bit line BLaL to the node L3 and to connect the bit line BLaL# to the node L4. The control signal $\phi$ TL is kept at the H level during the precharge operation (or precharge cycle shown in FIG. 10) and during this period the equalization and precharge operations are also carried out for the bit lines BLaL, BLaL# and the nodes L3, L4.

Because the transfer gate N9 consists of NMOS transistor and the gate voltage thereof is $V_{CC}$ level, the voltage potential of the node L3, which is connected to the H level of the bit line BLaL through the transfer gate N9 during the active operation is less than that of the threshold voltage of the transfer gate N9.

The control signal $\phi$ TR on the unselected side is maintained at the L level during the active operation, the transfer gates N16 and N17 are closed (the OFF state) to disconnect the bit line BLaR from the node L3 and the bit line BLaR# from the node L4.

In addition, when the precharge operation is entered, the control signal $\phi$ TR changes from the L level to the H level in order to equalize the bit lines BLaL, BLaL# and the nodes L3, L4.

The equalization circuit E2 is entered to the OFF state by the equalization signal EQLL# on the selected side during the L level in the active operation. When the precharge operation is commenced, the equalization circuit E2 is changed to the H level to commence the equalization and precharge operations.

The equalization signal EQLR# on the unselected side is maintained at the H level during the active operation, the equalization circuit E3 enters the ON state in order to carry out the equalization and precharge operations for the bit lines BLaR and BLaR#.

The bit lines which receive this type of control enter the precharge cycle and the bit lines on both the H level side and the L level side proceed to the $V_{BL}$ level.

When consideration is given to the charging and discharging of the bit lines during operation at low voltage such as $V_{CC}$ of 3.5, for example, the operation of charging the bit line on the L level side to the $V_{BL}$ level is carried out at the NMOS transistor N15 between the signal $V_{BL}$ and the bit line BLaL# and at the NMOS transistor N14 between the bit lines BLaL and BLaL#.

In addition, the equalization operation is carried out at the NMOS transistor N13.

The charging of the bit line on the L level side is carried out at a comparatively high speed because the source of the NMOS transistor N15 is connected to the bit line BLaL# and starts from the $V_{SS}$ level. On the other hand, when charging of the bit line on the H level side to the $V_{BL}$ level, the threshold value of the MOS transistors is high because the source of the NMOS transistor N15 is connected to the signal VBL and is at ½ $V_{CC}$ level, therefore the transistor characteristics such as the transconductance $\phi$ m decrease. This is even more severe in a low voltage operation.

The source of the equalization gate of the NMOS transistor N13 is connected to the bit line BLaL#, and as the charge operation proceeds, the source node floats so that the transistor characteristics such as the transconductance $\phi$ m gradually decline.

Because there are no transistors on the nodes L3 and L4 being charged or discharged during the equalization operation, the $V_{BL}$ precharge is carried out through the transfer gates N9, N10, N16, and N17 so that, in the same manner as for the bit lines, the equalization of the H level is delayed. The explanation of this point is the same as the explanation for the conventional example.

The active operation will now be considered.

First, if the row address strobe signal RAS# of the L level is received, the equalization control signal EQLC goes immediately (after a desired delay period) to the H level and the voltage is boosted for the control signals $\phi$ TL and $\phi$ TR and the equalizing signals EQLL# and EQLR#. The voltage is increased between the transfer gates N9, N10, N16, and N17 and the gate source of the NMOS transistors in the equalization circuits E2 and E3 so that the transistor characteristics improve. The equalization of the bit lines and the nodes L3 and L4 is completed by this operation.

Following this, the boosted level is returned to the Vcc level by the control signal SEN of the activation signal SAN#, and, if the row address signal RSL1 is determined, the unselected control signal $\phi$ TR and the selected equalizing signal EQLL# go to the Vss level.

Then, the cell data "0" is read at the rising edge of the word line WL0L; a minute voltage potential difference is applied to the bit line; the sense amplifier S2 is activated by the activation signal SAN#; the bit line BLaL on the L level side is amplified; and a read-out operation is performed.

In addition, the semiconductor integrated circuit of the second embodiment as shown in FIGS. 8, 9, and 10 inputs the equalizing control signal EQLC and the sense amplifier control signal SEN generated by delaying the row address signals RSL0 and RSL1 from a row address decoder and a row address strobe signal line RAS# with a desired delay time interval by the voltage booster 80. Then, The signals $\phi$ TL, $\phi$ TR and the equalizing signals EQLL# and EQLR# are boosted above the source potential $V_{CC}$ when a write-in to memory cells C3, C4 and C5, C6 or a read-out is activated.

Synchronized with the selection of the word lines WL0L, WL1L and WL0R, WL1R, the second or fifth signals (control signals) $\phi$ TL or $\phi$ TR on the memory cell array side selected by means of a row address are changed to the source potential $V_{CC}$; unselected second or fifth signals (control signals) $\phi$ TL or $\phi$ TR on the memory cell array side are changed to the ground potential $V_{SS}$; the third or sixth signals (equalizing signals) EQLL# or EQLR# on the memory cell array side selected by means of a row address are changed to the ground potential $V_{SS}$; and unselected third or sixth signals EQLL# or EQLR# on the memory cell array side are changed to the source potential $V_{CC}$.

As described above in the foregoing explanations in detail, in the period from the falling edge of the row address strobe signal line RAS# until prior to the activation of a differential amplifier circuit S1, a voltage boost is provided to transfer means N9 and N10 of bit lines BLaL and BLaL# respectively, to transfer means N16 and N17 of bit lines BLaR and BLaR# respectively, and to control signals φ TL, φ TR and EQLL#, EQLR# which supply the first and second equalizing means E2 and E3.

The back bias therefore becomes high, and it is possible to compensate for a reduction in transistor characteristics.

The equalization efficiency increases and, as a result, the low voltage operation margin for the bit line equalization is extended, so that it is possible to provide a semiconductor integrated circuit of high reliability.

What is claimed is:

1. A semiconductor integrated circuit including a plurality of memory cells arranged in matrix, selected by a plurality of word lines and a plurality of bit lines, operable in a precharge cycle and an activation cycle, comprising:

a word line in the word lines for selecting a group of the memory cells;

a first bit line and a second bit line in the bit lines, for selecting a pair of the memory cells located between the first bit line and the second bit line;

a first node and a second node through which data to or from the pair of the memory cells is transferred;

transfer means controlled by a first control signal, for connecting the first bit line to the first node and the second bit line to the second node;

sense amplifier means controlled by a second control signal, for sensing data on the first node and second node, located between the first node and the second node;

equalizing means controlled by a third control signal, for equalizing the first node and the second node, located between the first node and the second node;

voltage booster means for boosting the first control signal and the third control signal, wherein the first control signal and the third control signal are set at a power source voltage potential Vcc during the precharge cycle, the first control signal and the third control signal are boosted above the power source voltage potential $V_{CC}$ in the activation cycle after the precharge cycle, and the first control signal is changed to the power source voltage potential $V_{CC}$ and the third control signal is changed to a ground potential Vss in synchronization with a selection for the word line.

2. A semiconductor integrated circuit as claimed in claim 1, further comprises a second sense amplifier located between the first bit line and the second bit line for restoring data to the pair of the memory cells.

3. A semiconductor integrated circuit including a plurality of memory cell being grouped into a plurality of memory cell groups arranged in matrix, each memory cell being selected by a word line and a bit line, operable in a precharge cycle and an activation cycle, comprising:

a first bit line and a second bit line for connecting the memory cells in one memory cell group;

a first node and a second node through which data to or from the memory cells in one memory cell group is transferred;

transfer means controlled by a first control signal, for connecting the first bit line to the first node and the second bit line to the second node;

sense amplifier means controlled by a second control signal, for sensing data on the first node and second node, located between the first node and the second node;

equalizing means controlled by a third control signal, for equalizing the first node and the second node, located between the first node and the second node;

shared sense amplifier means controlled by a fourth control signal, located between two adjacent memory cell groups; and voltage booster means for boosting the first control signal and the third control signal located per a predetermined number of memory cell groups, wherein by the voltage booster means, during the precharge cycle, the first control signal and the third control signal of the memory cell group are set at a power source voltage potential Vcc, the first control signal of the memory cell group selected by the word line are boosted above the power source voltage potential $V_{CC}$ in the activation cycle after the precharge cycle, the first control signal of the memory cell group un-selected by a word address on the word line are set at the ground potential Vss in the activation cycle after the precharge cycle, and the third control signal of the memory cell group selected by the word line is changed to the ground potential $V_{SS}$ and the third control signal of the memory cell group un-selected by the word address on the word line is changed to the power source voltage potential Vcc.

4. A semiconductor integrated circuit as claimed in claim 1, wherein the voltage booster means comprises:

a drive circuit for generating a fourth control signal indicating the activation cycle and a fifth control signal indicating a non-activation cycle based on the word address on the word line; and a voltage booster circuit for inputting the fourth control signal and the fifth control signal from the drive circuit, and for boosting the fourth control signal and the fifth control signal, and outputting them as the first control signal and the third control signal, respectively.

5. A semiconductor integrated circuit as claimed in claim 4, wherein the voltage boosting means further comprises:

a voltage boosting level control circuit for setting the fourth and the fifth control signal below at a voltage potential which is the sum of the power source voltage $V_{CC}$ and the threshold voltage potential of the transfer means during the activation cycle.

6. A dynamic random access memory comprising:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit lines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit lines arranged in pairs in a one-to-one correspondence, each of said second memory cells being connected to either one of said third bit lines or one of said fourth bit lines;

a plurality of second word lines connected to said second memory cells for selectively coupling said second memory cells to said third and fourth bit lines; and a plurality of second equalizing circuits, each consisting of at least one transistor, for coupling the pairs of said third and fourth bit lines together by applying a third control signal to gates of said transistors of said second equalizing circuits, in order to equalize voltage levels on said third and fourth bit lines, each of said sense amplifiers being coupled to one of the pairs of said third and fourth bit lines through second transfer gates, for amplifying differential voltages between said third and fourth bit lines, said second transfer gates being activated by a fourth control signal, wherein the voltage level of said first control signal is boosted above said Vcc level, and then lowered to said Vss level in advance of activating one of said first word lines, and the voltage level of said third control signal is boosted above said Vcc level and then lowered to said Vss level in advance of activating one of said second word lines.

7. The dynamic random access memory as defined in claim 6, wherein each of said first and second equalizing circuits comprises:

a first transistor connected between said first and second bit lines;

a second transistor connected between said first bit line and a precharge voltage level line; and a third transistor connected between said second bit line and said precharge voltage level line, wherein said precharge voltage level line is at a predetermined potential within the range from said Vss level up to and including said Vcc level.

8. The dynamic random access memory as defined in claim 7, wherein said predetermined potential is at the midpoint between said Vcc level and said Vss level.

9. The dynamic random access memory as defined in claim 6, wherein each of said sense amplifiers comprises a pair of cross-coupled NMOS transistors, wherein a gate terminal of one of said pair of NMOS transistors is connected to a source terminal of the other, a source terminal of said one is connected to a drain terminal of the other, and a drain terminal of said one is connected to a gate terminal of the other.

10. The dynamic random access memory as defined in claim 9, wherein said first transfer gates comprise pairs of NMOS transistors for coupling said first and second bit lines with the gate terminals of said NMOS transistors of said sense amplifiers, said second transfer gates comprise pairs of NMOS transistors for coupling said third and fourth bit lines with the gate terminals of said NMOS transistors of said sense amplifiers, and gate terminals of said NMOS transistors of said first transfer gates receive said second control signal and gate terminals of said NMOS transistors of said second transfer gates receive said fourth control signal.

11. The dynamic random access memory as defined in claim 6, further comprising:

a plurality of first restoring sense amplifiers, each connected between one of the pairs of first and second bit lines, for restoring contents of said first memory cells; and a plurality of second restoring sense amplifiers each connected between one of the pairs of third and fourth bit lines, for restoring contents of said second memory cells, wherein said first restoring sense amplifiers are controlled by a fitch control signal and said second restoring sense amplifiers are controlled by a sixth control signal.

12. The dynamic random access memory as defined in claim 6, further comprising a voltage boost level control circuit for limiting the voltage level of said first and third control signals to less than the sum of the Vcc voltage level and the threshold voltage of one of the first or second equalizing circuits.

13. The dynamic random access memory as defined in claim 6, wherein the voltage level of said second control signal is boosted above said Vcc level before one of said first word lines is activated, and the voltage level of said fourth control signal is boosted above said Vcc level before one of said second word lines is activated.

14. The dynamic random access memory as defined in claim 6, wherein the voltage level of said second control signal is boosted above said Vcc level when one of said second word lines is deactivated, and lowered to said Vss level when one of said second word lines is activated, and the voltage level of said fourth control signal is boosted above said Vcc level when one of said first word lines is deactivated, and lowered to said Vss level when one of said first word lines is activated.

15. The dynamic random access memory as defined in claim 6, wherein the voltage level of said first control signal is boosted above said Vcc level when one of said first word lines is deactivated, and maintained above said Vcc level until one of said first word lines is activated, and the voltage level of said third control signal is boosted above said Vcc level when one of said second word lines is deactivated, and maintained above said Vcc level until one of said second word lines is activated.

16. A dynamic random access memory comprising:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit lines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit lines arranged in pairs in a one-to-one correspondence, each of said second memory cells being connected to either one of said third bit lines or one of said fourth bit lines;

a plurality of second word lines connected to said second memory cells for selectively coupling said second memory cells to said third and fourth bit lines; and a plurality of second equalizing circuits, each consisting of at least one transistor, for coupling the pairs of said third and fourth bit lines together by applying a third control signal to gates of said transistors of said second equalizing circuits, in order to equalize voltage levels on said third and fourth bit lines, each of said sense amplifiers being coupled to one of the pairs of said third and fourth bit lines through second transfer gates, for amplifying differential voltages between said third and fourth bit lines, said second transfer gates being activated by a fourth control signal, wherein the voltage level of said second control signal is boosted above said Vcc level in advance of activating one of said first word lines, and the voltage level of said fourth control signal is boosted above said Vcc level in advance of activating one of said second word lines.

17. The dynamic random access memory as defined in claim 16, wherein each of said first and second equalizing circuits comprises:

a first transistor connected between said first and second bit lines;

a second transistor connected between said first bit line and a precharge voltage level line; and a third transistor connected between said second bit line and said precharge voltage level line, wherein said precharge voltage level line is at a predetermined potential within the range from said Vss level up to and including said Vcc level.

18. The dynamic random access memory as defined in claim 17, wherein said predetermined potential is at the midpoint between said Vcc level and said Vss level.

19. The dynamic random access memory as defined in claim 16, wherein each of said sense amplifiers comprises a pair of cross-coupled NMOS transistors, wherein a gate terminal of one of said pair of NMOS transistors is connected to a source terminal of the other, a source terminal of said one is connected to a drain terminal of the other, and a drain terminal of said one is connected to a gate terminal of the other.

20. The dynamic random access memory as defined in claim 19, wherein said first transfer gates comprise pairs of NMOS transistors for coupling said first and second bit lines with the gate terminals of said NMOS transistors of said sense amplifiers, said second transfer gates comprise pairs of NMOS transistors for coupling said third and fourth bit lines with the gate terminals of said NMOS transistors of said sense amplifiers, and gate terminals of said NMOS transistors of said first transfer gates receive said second control signal and gate terminals of said NMOS transistors of said second transfer gates receive said fourth control signal.

21. The dynamic random access memory as defined in claim 16, further comprising:

a plurality of first restoring sense amplifiers, each connected between one of the pairs of first and second bit lines, for restoring contents of said first memory cells; and a plurality of second restoring sense amplifiers, each connected between one of the pairs of third and fourth bit lines, for restoring contents of said second memory cells, wherein said first restoring sense amplifiers are controlled by a fifth control signal and said second restoring sense amplifiers are controlled by a sixth control signal.

22. The dynamic random access memory as defined in claim 16, further comprising a voltage boost level control circuit for limiting the voltage level of said second and fourth control signals to less than the sum of the Vcc voltage level and the threshold voltage of one of the first or second transfer gates.

23. The dynamic random access memory as defined in claim 16, wherein the voltage level of said second control signal is boosted above said Vcc level when one of said second word lines is deactivated, and lowered to said Vss level when one of said second word lines is activated, and the voltage level of said fourth control signal is boosted above said Vcc level when one of said first word lines is deactivated, and lowered to said Vss level when one of said first word lines is activated.

24. The dynamic random access memory as defined in claim 16, wherein the voltage level of said first control signal is boosted above said Vcc level when one of said first word lines is deactivated, and maintained above said Vcc level until one of said first word lines is activated, and the voltage level of said third control signal is boosted above said Vcc level when one of said second word lines is deactivated, and maintained above said Vcc level until one of said second word lines is activated.

25. A dynamic random access memory comprising:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit fines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit lines arranged in pairs in a one-to-one correspondence, each of said second memory cells being connected to either one of said third bit lines or one of said fourth bit lines;

a plurality of second word lines connected to said second memory cells for selectively coupling said second memory cells to said third and fourth bit lines; and a plurality of second equalizing circuits, each consisting of at least one transistor, for coupling fie pairs of said third and fourth bit lines together by applying a third control signal to gates of said transistors of said second equalizing circuits in order to equalize voltage levels on said third and fourth bit lines, each of said sense amplifiers being coupled to one of the pairs of said third and fourth bit lines through second transfer gates, for amplifying differential voltages between said third and fourth bit lines, said second transfer gates being activated by a fourth control signal, wherein the voltage level of said second control signal is boosted above said Vcc level when one of said second word lines is deactivated, and lowered to said Vss level when one of said second word lines is activated, and the voltage level of said fourth control signal is boosted above said Vcc level when one of said first word lines is deactivated, and lowered to said Vss level when one of said first word lines is activated.

26. The dynamic random access memory as defined in claim 25, wherein each of said first and second equalizing circuits comprises:

a first transistor connected between said first and second bit lines;

a second transistor connected between said first bit line and a precharge voltage level line; and a third transistor connected between said second bit line and said precharge voltage level line, wherein said precharge voltage level line is at a predetermined potential within the range from said Vss level up to and including said Vcc level.

27. The dynamic random access memory as defined in claim 26, wherein said predetermined potential is at the midpoint between said Vcc level and said Vss level.

28. The dynamic random access memory as defined in claim 25, wherein each of said sense amplifiers comprises a pair of cross-coupled NMOS transistors, wherein a gate terminal of one of said pair of NMOS transistors is connected to a source terminal of the other, a source terminal of said one is connected to a drain terminal of the other, and a drain terminal of said one is connected to a gate terminal of the other.

29. The dynamic random access memory as defined in claim 28, wherein said first transfer gates comprise pairs of NMOS transistors for coupling said first and second bit lines with the gate terminals of said NMOS transistors of said sense amplifiers, said second transfer gates comprise pairs of NMOS transistors for coupling said third and fourth bit lines with the gate terminals of said NMOS transistors of said sense amplifiers, and gate terminals of said NMOS transistors of said first transfer gates receive said second control signal and gate terminals of said NMOS transistors of said second transfer gates receive said fourth control signal.

30. The dynamic random access memory as defined in claim 25, further comprising:

a plurality of first restoring sense amplifiers, each connected between one of the pairs of first and second bit lines, for restoring contents of said first memory cells; and a plurality of second restoring sense amplifiers each connected between one of the pairs of third and fourth bit lines, for restoring contents of said second memory cells, wherein said first restoring sense amplifiers are controlled by a fifth control signal and said second restoring sense amplifiers are controlled by a sixth control signal.

31. The dynamic random access memory as defined in claim 25, further comprising a voltage boost level control circuit for limiting the voltage level of said second and fourth control signals to less than the sum of the Vcc voltage level and the threshold voltage of one of the first or second transfer gates.

32. The dynamic random access memory as defined in claim 25, wherein the voltage level of said first control signal is boosted above said Vcc level when one of said first word lines is deactivated, and maintained above said Vcc level until one of said first word lines is activated, and the voltage level of said third control signal is boosted above said Vcc level when one of said second word lines is deactivated, and maintained above said Vcc level until one of said second word lines is activated.

33. A dynamic random access memory comprising:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit lines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit lines arranged in pairs in a one-to-one correspondence, each of said second memory cells being connected to either one of said third bit lines or one of said fourth bit lines;

a plurality of second word lines connected to said second memory cells for selectively coupling said second memory cells to said third and fourth bit lines; and a plurality of second equalizing circuits, each consisting of at least one transistor, for coupling the pairs of said third and fourth bit lines together by applying a third control signal to gates of said transistors of said second equalizing circuits, in order to equalize voltage levels on said third and fourth bit lines, each of said sense amplifiers being coupled to one of the pairs of said third and fourth bit lines through second transfer gates, for amplifying differential voltages between said third and fourth bit lines, said second transfer gates being activated by a fourth control signal, wherein the voltage level of said first control signal is boosted above said Vcc level when one of said first word lines is deactivated, and maintained above said Vcc level until one of said first word lines is activated, and the voltage level of said third control signal is boosted above said Vcc level when one of said second word lines is deactivated, and maintained above said Vcc level until one of said second word lines is activated.

34. The dynamic random access memory as defined in claim 33, wherein each of said first and second equalizing circuits comprises:

a first transistor connected between said first and second bit lines;

a second transistor connected between said first bit line and a precharge voltage level line; and a third transistor connected between said second bit line and said precharge voltage level line, wherein said precharge voltage level line is at a predetermined potential within the range from said Vss level up to and including said Vcc level.

35. The dynamic random access memory as defined in claim 34, wherein said predetermined potential is at the midpoint between said Vcc level and said Vss level.

36. The dynamic random access memory as defined in claim 33, wherein each of said sense amplifiers comprises a pair of cross-coupled NMOS transistors, wherein a gate terminal of one of said pair of NMOS transistors is connected to a source terminal of the other, a source terminal of said one is connected to a drain terminal of the other, and a drain terminal of said one is connected to a gate terminal of the other.

37. The dynamic random access memory as defined in claim 36, wherein said first transfer gates comprise pairs of NMOS transistors for coupling said first and second bit lines with the gate terminals of said NMOS transistors of said sense amplifiers, said second transfer gates comprise pairs of NMOS transistors for coupling said third and fourth bit lines with the gate terminals of said NMOS transistors of said sense amplifiers, and gate terminals of said NMOS transistors of said first transfer gates receive said second control signal and gate terminals of said NMOS transistors of said second transfer gates receive said fourth control signal.

38. The dynamic random access memory as defined in claim 33, further comprising:

a plurality of first restoring sense amplifiers, each connected between one of the pairs of first and second bit lines, for restoring contents of said first memory cells; and a plurality of second restoring sense amplifiers, each connected between one of the pairs of third and fourth bit lines, for restoring contents of said second memory cells, wherein said first restoring sense amplifiers are controlled by a fifth control signal and said second restoring sense amplifiers are controlled by a sixth control signal.

39. The dynamic random access memory as defined in claim 33, further comprising a voltage boost level control circuit for limiting the voltage level of said first and third control signals to less than the sum of the Vcc voltage level and the threshold voltage of one of the first or second equalizing circuits.

40. A method of driving a dynamic random access memory, said memory of the type having:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit lines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit lines arranged in pairs in a one-to-one correspondence, each of said second memory cells being connected to either one of said third bit lines or one of said fourth bit lines;

a plurality of second word lines connected to said second memory cells for selectively coupling said second memory cells to said third and fourth bit lines; and a plurality of second equalizing circuits, each consisting of at least one transistor, for coupling the pairs of said third and fourth bit lines together by applying a third control signal to gates of said transistors of said second equalizing circuits, in order to equalize voltage levels on said third and fourth bit lines, each of said sense amplifiers being coupled to one of the pairs of said third and fourth bit lines through second transfer gates, for amplifying differential voltages between said third and fourth bit lines, said second transfer gates being activated by a fourth control signal, said method comprising the steps of:

boosting the voltage level of said first control signal, which is applied to said first equalizing circuits, above said Vcc level;

lowering the voltage level of said first control signal to said Vss level, before activating one of said first word lines;

activating one of said first word lines; and activating said sense amplifiers to amplify differential voltages between the respective pairs of said first and second bit lines.

41. The method of driving a dynamic random access memory as defined in claim 40, wherein the voltage level of said first control signal is first elevated to said Vcc level and then boosted above said Vcc level.

42. The method of driving a dynamic random access memory as defined in claim 40, wherein the voltage level of said first control signal is boosted above said Vcc level after a row address strobe signal is received.

43. The method of driving a dynamic random access memory as defined in claim 40, further comprising the step of boosting the voltage level of said second control signal, which is applied to said first transfer gates, above said Vcc level, before the step of activating one of said first word lines.

44. The method of driving a dynamic random access memory as defined in claim 43, further comprising the steps of:

deactivating said one of said first word lines and said sense amplifiers;

boosting the voltage level of said fourth control signal above said Vcc level; and maintaining the voltage level of said fourth control signal above said Vcc level until one of said first word lines is activated.

45. The method of driving a dynamic random access memory as defined in claim 40, further comprising the steps of:

deactivating said one of said first word lines and said sense amplifiers;

boosting the voltage level of said first control signal above said Vcc level; and maintaining the voltage level of said first control signal above said Vcc level until one of said first word lines is activated.

46. A method of driving a dynamic random access memory, said memory of the type having:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit lines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit fines arranged in pairs in a one-to-one correspondence, each of said second memory cells being connected to either one of said third bit lines or one of said fourth bit lines;

a plurality of second word fines connected to said second memory cells for selectively coupling said second memory cells to said third and fourth bit lines; and a plurality of second equalizing circuits, each consisting of at least one transistor, for coupling the pairs of said third and fourth bit lines together by applying a third control signal to gates of said transistors of said second equalizing circuits, in order to equalize voltage levels on said third and fourth bit fines, each of said sense amplifiers being coupled to one of the pairs of said third and fourth bit lines through second transfer gates, for amplifying differential voltages between said third and fourth bit lines, said second transfer gates being activated by a fourth control signal, said method comprising the steps of:

boosting the voltage level of said second control signal, which is applied to said first transfer gates, above said Vcc level;

activating one of said first word lines; and activating said sense amplifiers to amplify differential voltages between the respective pairs of said first and second bit lines.

47. The method of driving a dynamic random access memory as defined in claim 46, wherein the voltage level of said second control signal is first elevated to said Vcc level and then boosted above said Vcc level.

48. The method of driving a dynamic random access memory as defined in claim 46, wherein the voltage level of said second control signal is boosted above said Vcc level after a row address strobe signal is received.

49. The method of driving a dynamic random access memory as defined in claim 46, further comprising the step of boosting the voltage level of said first control signal, which is applied to said first equalizing circuits, above said Vcc level, and then lowering the voltage level of said first control signal to said Vss level, before the step of activating one of said first word lines.

50. The method of driving a dynamic random access memory as defined in claim 46, further comprising the steps of:

deactivating said one of said first word lines and said sense amplifiers;

boosting the voltage level of said fourth control signal above said Vcc level; and maintaining the voltage level of said fourth control signal above said Vcc level until one of said first word lines is activated.

51. The method of driving a dynamic random access memory as defined in claim 49, further comprising the steps of:

deactivating said one of said first word lines and said sense amplifiers;

boosting the voltage level of said first control signal above said Vcc level; and maintaining the voltage level of said first control signal above said Vcc level until one of said first word lines is activated.

52. A method of driving a dynamic random access memory, said memory of the type having:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit lines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit lines arranged in pairs in a one-to-one correspondence, each of said second memory cells being connected to either one of said third bit lines or one of said fourth bit lines;

a plurality of second word lines connected to said second memory cells for selectively coupling said second memory cells to said third and fourth bit lines; and a plurality of second equalizing circuits, each consisting of at least one transistor, for coupling the pairs of said third and fourth bit lines together by applying a third control signal to gates of said transistors of said second equalizing circuits, in order to equalize voltage levels on said third and fourth bit lines, each of said sense amplifiers being coupled to one of the pairs of said third and fourth bit lines through second transfer gates, for amplifying differential voltages between said third and fourth bit lines, said second transfer gates being activated by a fourth control signal, said method comprising the steps of:

lowering said fourth control signal to said Vss level;

activating one of said first word lines;

activating said sense amplifiers to amplify differential voltages between the respective pairs of said first and second bit lines;

deactivating said one of said first word lines and said sense amplifiers;

boosting the voltage level of said fourth control signal above said Vcc level; and maintaining the voltage level of said fourth control signal above said Vcc level until one of said first word fines is activated.

53. The method of driving a dynamic random access memory as defined in claim 52, wherein the voltage level of said fourth control signal is first elevated to said Vcc level and then boosted above said Vcc level.

54. The method of driving a dynamic random access memory as defined in claim 52, wherein the voltage level of said fourth control signal is boosted above said Vcc level after a row address strobe signal is received.

55. The method of driving a dynamic random access memory as defined in claim 52, further comprising the step of boosting the voltage level of said first control signal, which is applied to said first equalizing circuits, above said Vcc level, and then lowering the voltage level of said first control signal to said Vss level, before the step of activating one of said first word lines.

56. The method of driving a dynamic random access memory as defined in claim 55, further comprising the steps of:

boosting the voltage level of said first control signal above said Vcc level, after deactivating said one of said first word lines and said sense amplifiers; and maintaining the voltage level of said first control signal above said Vcc level until one of said first word lines is activated.

57. A method of driving a dynamic random access memory, said memory of the type having:

a first array consisting of a plurality of first memory cells;

a plurality of first and second bit lines arranged in pairs in a one-to-one correspondence, each of said first memory cells being connected to either one of said first bit lines or one of said second bit lines;

a plurality of first word lines connected to said first memory cells for selectively coupling said first memory cells to said first and second bit lines;

a plurality of first equalizing circuits, each consisting of at least one transistor, for coupling the pairs of said first and second bit lines together by applying a first control signal to gates of said transistors of said first equalizing circuits, in order to equalize voltage levels on said first and second bit lines;

a plurality of sense amplifiers, each coupled to one of the pairs of said first and second bit lines through first transfer gates, for amplifying differential voltages between said first and second bit lines, said first transfer gates being activated by a second control signal;

a second array consisting of a plurality of second memory cells;

a plurality of third and fourth bit lines arranged in pairs in a one-to-one correspondence, each of said second memory cells being connected to either one of said third bit lines or one of said fourth bit lines;

a plurality of second word lines connected to said second memory cells for selectively coupling said second memory cells to said third and fourth bit lines; and a plurality of second equalizing circuits, each consisting of at least one transistor, for coupling the pairs of said third and fourth bit lines together by applying a third control signal to gates of said transistors of said second equalizing circuits, in order to equalize voltage levels on said third and fourth bit lines, each of said sense amplifiers being coupled to one of the pairs of said third and fourth bit lines through second transfer gates, for amplifying differential voltages between said third and fourth bit lines, said second transfer gates being activated by a fourth control signal, said method comprising the steps of:

lowering said first control signal to said Vss level;

activating one of said first word lines;

activating said sense amplifiers to amplify differential voltages between the respective pairs of said first and second bit lines;

deactivating said one of said first word lines and said sense amplifiers;

boosting the voltage level of said first control signal above said Vcc level; and maintaining the voltage level of said first control signal above said Vcc level until one of said first word lines is activated.

58. The method of driving a dynamic random access memory as defined in claim 57, wherein the voltage level of said first control signal is first elevated to said Vcc level and then boosted above said Vcc level.

59. The method of driving a dynamic random access memory as defined in claim 57, wherein the voltage level of said first control signal is boosted above said Vcc level after a row address strobe signal is received.

60. The method of driving a dynamic random access memory as defined in claim 57, further comprising the step of boosting the voltage level of said second control signal, which is applied to said first transfer gates, above said Vcc level, before the step of activating one of said first word lines.

61. The method of driving a dynamic random access memory as defined in claim 60, further comprising the steps of:

boosting the voltage level of said fourth control signal above said Vcc level, after deactivating said one of said first word lines and said sense amplifiers; and maintaining the voltage level of said fourth control signal above said Vcc level until one of said first word lines is activated.

62. A semiconductor memory comprising:

at least one plurality of memory cells;

a plurality pairs of bit lines, the memory cells being selectively coupled to the bit lines;

a plurality of word lines connected to the memory cells for selectively coupling the memory cells to the bit lines;

a plurality of equalizing circuits, each consisting of at least one transistor, for equalizing voltage levels on the pairs of bit lines by applying a first control signal to the equalizing circuits; and a plurality of sense amplifiers for amplifying differential voltages between the pairs of bit lines, wherein the first control signal is boosted above the Vcc level, and then lowered to the Vss level in advance of activating one of the word lines.

63. The semiconductor memory as defined in claim 62, wherein the first control signal is boosted above the Vcc level during the activation cycle, which is after the precharge cycle.

64. The semiconductor memory as defined in claim 63, wherein the first control signal is again boosted above the Vcc level after the one of the word lines is deactivated, and is maintained above the Vcc level until a subsequent activation of one of the word lines.

65. The semiconductor memory as defined in claim 62, wherein the first control signal is lowered to the Vss level in synchronization with the activation of one of the word lines.

66. The semiconductor memory as defined in claim 62, wherein each of the equalizing circuits comprises a first transistor connected between bit lines of one of the pairs of bit lines for shorting the bit lines together.

67. The semiconductor memory as defined in claim 66, wherein each of the equalizing circuits further comprises:

a second transistor connected between one bit line from the pair of bit lines and a precharge voltage level line; and a third transistor connected between the other bit line from the pair of bit lines and the precharge voltage level line, wherein the precharge voltage level line is at a predetermined potential within the range from the Vss level up to and including the Vcc level.

68. The semiconductor memory as defined in claim 62, further comprising a plurality of transfer gates, each for coupling one of the pairs of bit lines to one of the sense amplifiers, the transfer gates being activated by a second control signal, wherein the voltage level of the second control signal is boosted above the Vcc level in advance of activating one of the word lines.

69. The semiconductor memory as defined in claim 68, wherein the second control signal is boosted above the Vcc level during the activation cycle, which is after the precharge cycle.

70. The semiconductor memory as defined in claim 69, wherein the second control signal is lowered to the Vcc level in advance of activating one of the word lines, and is again boosted above the Vcc level after the one of the word lines is deactivated.

71. The semiconductor memory as defined in claim 70, further comprising:

a voltage boost circuit for boosting the first and second control signals above the Vcc level to a boosted voltage level;

a level control circuit for limiting the boosted voltage level to less than the sum of tile Vcc voltage level and the threshold voltage of one of the transfer gates.

72. The semiconductor memory as defined in claim 70, wherein the second control signal is lowered to the Vcc level in synchronization with the activation of one of the word lines.

* * * * *